(12) United States Patent
Wada et al.

(10) Patent No.: US 10,472,446 B2
(45) Date of Patent: Nov. 12, 2019

(54) COMPOSITION, RESIN MOLD, PHOTO IMPRINTING METHOD, METHOD FOR MANUFACTURING OPTICAL ELEMENT, AND METHOD FOR MANUFACTURING ELECTRONIC ELEMENT

(71) Applicant: TOYO GOSEI CO., LTD., Ichikawa-shi, Chiba (JP)

(72) Inventors: Risa Wada, Ichikawa (JP); Takeshi Osaki, Ichikawa (JP)

(73) Assignee: TOYO GOSEI CO., LTD., Ichikawa-shi, Chiba (JP)

( * ) Notice: Subject to any disclaimer, the term of this patent is extended or adjusted under 35 U.S.C. 154(b) by 0 days.

(21) Appl. No.: 14/773,268

(22) PCT Filed: Mar. 3, 2014

(86) PCT No.: PCT/JP2014/055335
§ 371 (c)(1),
(2) Date: Sep. 4, 2015

(87) PCT Pub. No.: WO2014/136731
PCT Pub. Date: Sep. 12, 2014

(65) Prior Publication Data
US 2016/0017074 A1    Jan. 21, 2016

(30) Foreign Application Priority Data
Mar. 4, 2013    (JP) .................................. 2013-042352

(51) Int. Cl.
*C08F 222/10*    (2006.01)
*C08F 290/06*    (2006.01)
(Continued)

(52) U.S. Cl.
CPC .......... *C08F 222/10* (2013.01); *C08F 290/06* (2013.01); *C08F 299/024* (2013.01);
(Continued)

(58) Field of Classification Search
CPC .. C08F 222/10; C08F 299/024; C08F 290/06; G03F 7/0002; B29C 59/02; C07C 271/16
See application file for complete search history.

(56) References Cited

U.S. PATENT DOCUMENTS 6,306,563 B1    10/2001    Xu et al.
6,555,288 B1    4/2003    Xu et al.
(Continued)

FOREIGN PATENT DOCUMENTS

AU    2003205287 A1    9/2003
AU    2004318602 A1    10/2005
(Continued)

OTHER PUBLICATIONS

Koo, machine English translation of JP 2012-518067 (dated Aug. 2012).*
(Continued)

*Primary Examiner* — Nicholas E Hill
(74) *Attorney, Agent, or Firm* — TraskBritt (57) ABSTRACT

Described is a composition comprising: a compound (A) having a substituent (a) being at least either one of an acryloyl group and a methacryloyl group, and a perfluoroalkylene group; and a compound (B) having a substituent (b) being either one of an acryloyl group and a methacryloyl group, and a substituent (c) being either one of an acryloyl group and a methacryloyl group.

22 Claims, 2 Drawing Sheets

(51) Int. Cl.
  *G03F 7/00* (2006.01)
  *C08F 299/02* (2006.01)
  *G03F 7/004* (2006.01)
  *G03F 7/027* (2006.01)

(52) U.S. Cl.
  CPC .......... *G03F 7/0002* (2013.01); *G03F 7/0046* (2013.01); *G03F 7/027* (2013.01)

(56) References Cited

U.S. PATENT DOCUMENTS

| | | | |
|---|---|---|---|
| 8,420,124 | B2 | 4/2013 | Desimone et al. |
| 2002/0006586 | A1 | 1/2002 | Xu et al. |
| 2003/0176629 | A1 | 9/2003 | Blomquist et al. |
| 2003/0181633 | A1 | 9/2003 | Blomquist et al. |
| 2003/0207215 | A1 | 11/2003 | Xu et al. |
| 2005/0234152 | A1* | 10/2005 | Ramsey ............... C03C 17/007 523/160 |
| 2007/0264481 | A1 | 11/2007 | Desimone et al. |
| 2007/0275193 | A1 | 11/2007 | DeSimone et al. |
| 2009/0028910 | A1 | 1/2009 | Desimone et al. |
| 2009/0281250 | A1 | 11/2009 | DeSimone et al. |
| 2011/0209159 | A1 | 8/2011 | Baratz et al. |
| 2011/0298158 | A1 | 12/2011 | Koo et al. |
| 2012/0060903 | A1 | 3/2012 | Fontana et al. |
| 2012/0156510 | A1 | 6/2012 | Okafuji et al. |
| 2012/0256354 | A1 | 10/2012 | DeSimone et al. |
| 2013/0228950 | A1 | 9/2013 | DeSimone et al. |
| 2015/0368453 | A1 | 12/2015 | Wada et al. |

FOREIGN PATENT DOCUMENTS

| | | |
|---|---|---|
| BR | PI0417848 A | 4/2007 |
| CA | 2549341 A1 | 10/2005 |
| CN | 1622966 | 6/2005 |
| CN | 1628141 A | 6/2005 |
| CN | 1831032 A | 9/2006 |
| CN | 101147239 A | 3/2008 |
| CN | 101885815 A | 11/2010 |
| CN | 102016814 A | 4/2011 |
| CN | 102449039 A | 5/2012 |
| CN | 102459378 A | 5/2012 |
| DE | 60142456 | 11/2007 |
| DE | 60036872 T2 | 10/2008 |
| EP | 1203031 A1 | 5/2002 |
| EP | 1352009 | 10/2003 |
| EP | 1472304 | 11/2004 |
| EP | 1704585 A2 | 9/2006 |
| EP | 1845109 A2 | 10/2007 |
| EP | 1854822 A1 | 11/2007 |
| EP | 2221664 A1 | 8/2010 |
| EP | 2399167 A1 | 12/2011 |
| EP | 2435506 A1 | 4/2012 |
| IL | 176254 A | 8/2012 |
| JP | 2002539604 A | 11/2002 |
| JP | 2003-502718 A | 1/2003 |
| JP | 2004527782 A | 9/2004 |
| JP | 2004351693 A | 12/2004 |
| JP | 2005-517081 A | 6/2005 |
| JP | 2006137021 A | 6/2006 |
| JP | 2007526820 A | 9/2007 |
| JP | 2007527784 A | 10/2007 |
| JP | 2009096927 A | 5/2009 |
| JP | 2010018815 A | 1/2010 |
| JP | 2010033693 A | 2/2010 |
| JP | 2010143092 A | 7/2010 |
| JP | 2011-223009 A | 11/2011 |
| JP | 2012096542 A | 5/2012 |
| JP | 2012518067 A | 8/2012 |
| JP | 2012528217 A | 11/2012 |
| JP | 2012-242722 A | 12/2012 |
| JP | 2013-193611 A | 9/2013 |
| JP | 2014080585 A | 5/2014 |
| JP | 2014091776 A | 5/2014 |
| KR | 10-2007-0011253 A | 1/2007 |
| KR | 10-2011-0114695 A | 10/2011 |
| MX | PA06006738 A | 8/2006 |
| WO | 0054107 A1 | 9/2000 |
| WO | 00/78819 A1 | 12/2000 |
| WO | 0250583 A2 | 6/2002 |
| WO | 03/67285 A2 | 8/2003 |
| WO | 2005084191 A2 | 9/2005 |
| WO | 2005101466 A2 | 10/2005 |
| WO | 2010094661 A1 | 8/2010 |
| WO | 2010136392 A1 | 12/2010 |
| WO | 2010147142 A1 | 12/2010 |
| WO | 2014104074 A1 | 7/2014 |
| WO | 2014136731 A1 | 9/2014 |

OTHER PUBLICATIONS

Rolland et al., High Resolution Soft Lithography: Enabling Materials for Nanotechnologies, Angew. Chem. Int. Ed., 2004, pp. 5796-5799, vol. 43.
PCT International Search Report, PCT/JP2014/055335, dated Jun. 3, 2014.
U.S. Appl. No. 14/655,047 naming common inventors, filed Jun. 23, 2015.
Morizawa et al., Fluorine Chemistry at Asahi Glass, Present and Future, Res. Reports Asahi Glass Co., Ltd., 57, 2007.
Japanese Notification of Reasons for Refusal for Patent Application No. 2015-504302, dated Apr. 11, 2018.
Chinese First Office Action for Chinese Application No. 201480012123, dated Jan. 23, 2017, 15 pages with English Translation.
Chinese Search Report for Chinese Application No. 201480012123, dated Jan. 9, 2017, 2 pages.
Chinese Second Office Action for Chinese Application No. 201480012123, dated Oct. 25, 2017, 16 pages with English Translation.
Chinese Third Office Action for Chinese Application No. 201480012123, dated May 11, 2018, 13 pages with English Translation.
International Written Opinion for International Application No. PCT/JP2014/055335, dated Jun. 3, 2014, 11 pages.
Japanese Decision to Grant for Japanese Application No. 2015-504302, dated May 17, 2019, 5 pages with English Translation.
Japanese Notice of Reasons for Refusal for Japanese Application No. 2015-504302, dated Oct. 12, 2018, 10 pages with English Translation.

* cited by examiner

COMPOSITION, RESIN MOLD, PHOTO IMPRINTING METHOD, METHOD FOR MANUFACTURING OPTICAL ELEMENT, AND METHOD FOR MANUFACTURING ELECTRONIC ELEMENT

CROSS-REFERENCE TO RELATED APPLICATIONS

This application is a national phase entry under 35 U.S.C. § 371 of International Patent Application PCT/JP2014/055335, filed Mar. 3, 2014, designating the United States of America and published as International Patent Publication WO 2014/136731 A1 on Sep. 12, 2014, which claims the benefit under Article 8 of the Patent Cooperation Treaty and under 35 U.S.C. § 119(e) to Japanese Patent Application Serial No. 2013-042352, filed Mar. 4, 2013, the disclosure of each of which is hereby incorporated herein in its entirety by this reference.

TECHNICAL FIELD

Some embodiments of this disclosure relate to a composition, a method for manufacturing a resin, an imprinting method, a method for manufacturing an optical element, and a method for manufacturing an electronic element.

BACKGROUND

In recent years, technologies for processing fine patterns have been becoming more important in the manufacturing of semiconductor integrated circuits and optical elements, and one of such technologies is an imprinting method.

The imprinting method is a technology in which a mold having a concavo-convex pattern (hereinafter also referred to as a "mold") is pressed against a material to be transferred formed on a substrate, whereby a pattern corresponding to the concavo-convex pattern is transferred onto the substrate, and a fine pattern at a nano-order can be formed by this imprinting method.

Focusing attention on the transfer process, the imprinting method is classified into two methods: a photo imprinting method and a thermal imprinting method. In the photo printing method and thermal printing method, a photocurable composition and a thermosetting composition are, respectively, used as a material to be transferred. The former photo imprinting method gains attention since it does not require heating and can form a pattern at room temperature, and thus has advantages that the pattern is minimally deformed and that positioning a substrate and a mold can be easily performed by using a transparent mold (for example, Patent Literature 1).

Examples of the mold that is generally used in this imprinting method include molds that are formed of quartz or metals such as nickel. As for the molds formed of quartz, patterns are formed on quartz substrates, and the like, by semiconductor fine processing technologies such as photolithography and etching. Furthermore, as for the molds formed of metals, patterns are formed by providing metal plating to a surface of a mold formed of quartz by an electric casting (electroforming) method (for example, a nickel plating method), and peeling this metal plating layer.

However, the molds prepared by such methods had problems in that they are very expensive and it takes long periods of time for the preparation.

Under such situations, a product formed by transferring a pattern on a resin by using the above-mentioned mold as a master mold, which is used as a resin mold, is disclosed.

The following Non-patent Literature 1 discloses a resin mold prepared by using a photocurable composition formed of a urethane methacrylate represented by the following formula and a photopolymerization initiator. However, Non-patent Literature 1 does not describe the durability relating to the resin mold disclosed therein.

CITATION LIST

Patent Literature

Patent Literature 1: JP 2002-539604 W

Non-Patent Literature

Non-patent Literature 1: Jason P. Rolland et al., Angew. Chem. Int. Ed. 2004, 43, P5796-5799 (Germany)

BRIEF SUMMARY

Technical Problem

In view of the above-mentioned circumstances, some embodiments of this disclosure relate to a composition, and the like, from which a resin mold suitable for an imprinting method can be prepared.

Solution to Problem

The first composition relating to an aspect of this disclosure includes a compound (A) having a substituent (a) being at least either one of an acryloyl group and a methacryloyl group, and a perfluoroalkylene group; and a compound (B) having a substituent (b) being either one of an acryloyl group and a methacryloyl group, and a substituent (c) being either one of an acryloyl group and a methacryloyl group. Compound (A) has a carbon-fluorine bond having a stronger bonding force than that of a carbon-hydrogen bond, and thus has high stability. Therefore, for example, it is highly possible that a resin manufactured by curing the above-mentioned composition has excellent properties such as being difficult to deteriorate.

It is desirable that the above-mentioned composition has a curable property by light. Since the above-mentioned composition can be cured without using heat, even in the case when it is necessary to coexist with other elements or parts that are deteriorated by heat during curing, a resin can be obtained while suppressing the deterioration of the elements or parts.

In the above-mentioned composition, it is desirable that the above-mentioned composition contains at least either one compound of a compound represented by the following formula (1) and a compound represented by the following formula (2).

[Formula 1]

(1)

wherein, each of $R^1$, $R^2$, $R^3$ and $R^4$ in formula (1) represents a substituent containing at least one of a hydrogen atom, a carbon atom, a nitrogen atom and a sulfur atom, and n in formula (1) represents an integer of 1 to 10,

[Formula 2]

(2)

wherein, each of $R^5$, $R^6$, $R^7$ and $R^8$ in formula (2) represents a substituent containing at least one of a hydrogen atom, a carbon atom, a nitrogen atom and a sulfur atom, and each of m and r in formula (2) represents an integer of 1 to 30.

In the above-mentioned composition, it is preferable that each of $R^1$ and $R^2$ in the above-mentioned compound represented by formula (1) is either one of a hydrogen atom and a methyl group.

In the above-mentioned composition, it is preferable that each of $R^5$ and $R^6$ in the above-mentioned compound represented by formula (2) is either one of a hydrogen atom and a methyl group.

In the above-mentioned composition, it is preferable that at least one of parts represented by the following formula (3) and formula (4) of the compound represented by formula (1) contains any one of structures represented by the following formula (5), formula (6) and formula (7).

[Formula 4]

(8)

wherein, in formula (4), $R^{13}$ each independently represents a hydrogen atom or a methyl group.

In the above-mentioned composition, at least one of parts represented by the following formula (9) and formula (10) of the compound represented by formula (2) contains any one of structures represented by the following formula (11), formula (12) and formula (13),

[Formula 5]

[Formula 3]

wherein, j in formula (5) represents 1 or 2, and each of $R^9$, $R^{10}$, $R^{11}$ and $R^{12}$ in formula (6) is any one of a hydrogen atom, a methyl group and a substituent represented by the following formula (8), wherein, k in formula (11) represents 1 or 2, and each of $R^{14}$, $R^{15}$, $R^{16}$ and $R^{17}$ in formula (12) is any one of a hydrogen atom, a methyl group and a substituent represented by the following formula (14),

[Formula 6]

(14)

wherein, $R^{18}$ in formula (14) represents a hydrogen atom or a methyl group.

In the above-mentioned composition, it is preferable that $R^{11}$ is either one of a hydrogen atom and a methyl group, and each of $R^{10}$ and $R^{12}$ is a hydrogen atom when $R^9$ is the substituent represented by formula (8); $R^{12}$ is either one of a hydrogen atom and a methyl group, and each of $R^9$ and $R^{11}$ is a hydrogen atom when $R^{10}$ is the substituent represented by formula (8); $R^9$ is either one of a hydrogen atom and a methyl group, and each of $R^{10}$ and $R^{12}$ is a hydrogen atom when $R^{11}$ is the substituent represented by formula (8); and $R^{10}$ is either one of a hydrogen atom and a methyl group, and each of $R^9$ and $R^{11}$ is a hydrogen atom when $R^{12}$ is the substituent represented by formula (8).

In the above-mentioned composition, it is preferable that $R^{16}$ is either one of a hydrogen atom and a methyl group, and each of $R^{15}$ and $R^{17}$ is a hydrogen atom when $R^{14}$ is the substituent represented by formula (14); $R^{17}$ is either one of a hydrogen atom and a methyl group, and each of $R^{14}$ and $R^{16}$ is a hydrogen atom when $R^{15}$ is the substituent represented by formula (14); $R^{14}$ is either one of a hydrogen atom and a methyl group, and each of $R^{15}$ and $R^{17}$ is a hydrogen atom when $R^{16}$ is the substituent represented by formula (14); and $R^{15}$ is either one of a hydrogen atom and a methyl group, and each of $R^{14}$ and $R^{16}$ is a hydrogen atom when $R^{17}$ is the substituent represented by formula (14).

In the above-mentioned composition, it is preferable that each of $R^9$, $R^{10}$, $R^{11}$ and $R^{12}$ is a hydrogen atom.

In the above-mentioned composition, it is preferable that each of $R^{14}$, $R^{15}$, $R^{16}$ and $R^{17}$ is a hydrogen atom.

In the above-mentioned composition, it is preferable that compound (B) has a plurality of substituents with polymerization activity, each of the plurality of substituents is either one of an acryloyl group and a methacryloyl group, and a value being a molecular weight of compound (B) divided by a total number of the acryloyl group and the methacryloyl group contained in compound (B) is within the range of 85 to 230. By this way, for example, effects that a resin having a more highly cross-linked structure can be obtained, and the like are exerted, and such resin can suppress swelling by the permeation of molecules such as water and solvents. The above-mentioned compound (B) may contain only one or both of an acryloyl group and a methacryloyl group.

The method for manufacturing a resin relating to an aspect of this disclosure includes curing the above-mentioned composition.

The method for imprinting a resin relating to an aspect of this disclosure includes curing the above-mentioned composition.

The methods for manufacturing an optical element and an electronic element relating to an aspect of this disclosure includes curing the above-mentioned composition.

DETAILED DESCRIPTION

The compositions relating to some embodiments of this disclosure contains a first compound (A) having a substituent (a) being at least either one of an acryloyl group and a methacryloyl group, and a perfluoroalkylene group; a second compound having a substituent (b) being either one of an acryloyl group and a methacryloyl group, and a substituent (c) being either one of an acryloyl group and a methacryloyl group. Since the above-mentioned first compound has a carbon-fluorine bond having a stronger bonding force than that of a carbon-hydrogen bond, it becomes possible to obtain a resin being excellent in durability by curing the above-mentioned composition. For example, if a resin manufactured by this way is used as a resin mold, the resin mold can withstand repeating formations of photocured layers. In the above-mentioned composition, it is preferable that the mixing ratio of the first compound to the second compound is from 40:60 to 99.9:0.1 (mass ratio) by mass.

The compound contained in the composition relating to some embodiments of this disclosure has a plurality of substituents with polymerization activity. Examples of the above-mentioned substituents include, for example, an acryloyl group, a methacryloyl group, and the like. By decreasing the molecular weight relative to one substituent of the above-mentioned plurality of substituents, the cross-linking degree of a resin obtained by curing the above-mentioned composition increases, whereby the impregnation of the resin with the components such as a resin precursor and a solvent that are used for forming a photocured layer can be suppressed. If this resin is used as a resin mold, the swelling of the resin mold is suppressed, and the change in the pitches of the concavo-convex is suppressed, and thus it becomes possible to use the resin mold for the formation of a transferred material layer repeatedly.

In the above-mentioned composition, it is desirable that the above-mentioned composition contains at least either one compound of the compound represented by the following formula (1) and the compound represented by the following formula (2).

[Formula 7]

(1)

wherein, each of R¹, R², R³ and R⁴ in formula (1) represents a substituent containing at least one of a hydrogen atom, a carbon atom, a nitrogen atom and a sulfur atom, and n in formula (1) represents an integer of 1 to 10,

[Formula 8]

(2)

wherein, each of R⁵, R⁶, R⁷ and R⁸ in formula (2) represents a substituent containing at least one of a hydrogen atom, a carbon atom, a nitrogen atom and a sulfur atom, and each of m and r in formula (2) represents an integer of 1 to 30.

The method for manufacturing the compound represented by the above-mentioned formula (1) is suitably selected. For example, the compound can be manufactured as follows.

An isocyanate containing at least either one of an acryloyl group and a methacryloyl group, and a fluorinated polytetramethylene glycol represented by the following formula (15), are reacted in the presence of a catalyst as necessary, whereby a urethane compound including at least either one of an acryloyl group and a methacryloyl group is obtained.

[Formula 9]

(15)

The n in formula (15) represents an integer of 1 to 10. Furthermore, examples of the isocyanate including at least either one of an acryloyl group and a methacryloyl group include, for example, "Karenz" manufactured by Showa Denko K. K. (for example, KARENZAOI™, KARENZMOI®, KARENZBEI™ and KARENZMOI-EG™) and the like.

Examples of the above-mentioned fluorinated polytetramethylene glycol represented by formula (15) include, for example, "Fluorinated PTMG250 DIOL" and "Fluorinated PTMG650 DIOL" manufactured by Exfluor Research Corp., and the like, and these products are mixtures that mainly contain the fluorinated polytetramethylene glycol wherein n in the above-mentioned formula (15) is an integer of 1 to 10.

The ratio for reacting the isocyanate containing at least either one of an acryloyl group and a methacryloyl group, and the fluorinated polytetramethylene glycol, is suitably selected. For example, the isocyanate containing at least either one of an acryloyl group and a methacryloyl group:the fluorinated polytetramethylene glycol=1:0.8 to 1.2 (molar ratio). These may be reacted without a solvent, or in the presence of a solvent. In the case when a reaction solvent is used, examples of the reaction solvent include, for example, 1,4-dioxane, tetrahydrofuran, toluene, fluorinated ethers, such as "Novec" manufactured by Sumitomo 3M Limited (for example, Novec 7100, 7200 and 7300) and "GALDEN®" manufactured by Solvay Specialty Polymers Japan (for example, GALDEN® SV70, SV90 and SV110), and the like. Furthermore, examples of the catalyst include catalysts for general urethane synthesis such as dibutyltin dilaurate, and the like. As for the reaction conditions, for example, a reaction temperature is within the range of 40° C. to 80° C. and a reaction time is within the range of 2 to 5 hours.

Examples of the compound represented by the above-mentioned formula (2) include, for example, "FLUOROLINK® MD700" and "FOMBLIN® MD40" manufactured by Solvay Specialty Polymers Japan.

The total content of the above-mentioned compound represented by formula (1) and the compound represented by formula (2) in the compositions in some embodiments of this disclosure is suitably selected. The total content is from 40 to 99.9 mass %, more preferably from 70 to 99 mass %. If the content is 70 mass % or more, the fluorine content in the composition is high and, thus, the mold release property and durability of the obtained resin mold are improved.

The content of the above-mentioned compound (B) is suitably selected, and is preferably from 0.1 to 60 mass %, more preferably from 1 to 40 mass %, especially preferably from 5 to 20 mass % in the composition. In this range, the cross-linking degree of a resin mold obtained by curing to the extent that the resin mold suppresses the impregnation of low molecules such as a resin precursor, and the ease of peeling of the resin mold from the resin obtained by curing the resin precursor (mold release property) can be attained at the same time.

As a preferable specific example of compound (B), compound (B) having a value being a molecular weight of compound (B) divided by a total number of the acryloyl group and the methacryloyl group contained in compound (B) of within the range of 85 to 230 is preferable. Compound (B) may contain only either one of, or both of an acryloyl group and a methacryloyl group.

As compound (B), for example, the following compounds are exemplified.

Ethylene glycol diacrylate, ethylene glycol dimethacrylate, and a polyethylene glycol diacrylate as represented by the following formula (16), wherein n=1 to 5,

[Formula 10]

(16)

and a polyethylene glycol dimethacrylate as represented by the following formula (17), wherein n=1 to 4,

[Formula 11]

(17)

Propylene glycol diacrylate, propylene glycol dimethacrylate, and a polypropylene diacrylate as represented by the following formula (18), wherein n=1 to 3,

[Formula 12]

(18)

and a polypropylene dimethacrylate as represented by the following formula (19), wherein n=1 to 3,

[Formula 13]

(19)

and a polytetramethylene glycol diacrylate as represented by the following formula (20), wherein n=1 to 2,

[Formula 14]

(20)

and a polytetramethylene glycol dimethacrylate as represented by the following formula (21), wherein n=1 to 2,

[Formula 15]

(21)

1,3-Butanediol diacrylate, 1,4-butanediol diacrylate, 1,5-pentanediol diacrylate, 1,6-hexanediol diacrylate, 1,7-heptanediol diacrylate, 1,8-octanediol diacrylate, 1,9-nonanediol diacrylate, 1,10-decanediol diacrylate, 2-methyl-1.8-octanediol diacrylate, neopentyl glycol diacrylate, glycerin diacrylate, bis(acryloxyneopentyl glycol) adipate, glycerin diacrylate, 2-hydroxy-3-acryloyloxypropyl methacrylate, trimethylolpropane triacrylate, 1,3-butanediol dimethacrylate, 1,4-butanediol dimethacrylate, 1,5-pentanediol dimethacrylate, 1,6-hexanediol dimethacrylate, 1,7-heptanediol dimethacrylate, 1,8-octanediol dimethacrylate, 1,9-nonanediol dimethacrylate, 1,10-decanediol dimethacrylate, 2-methyl-1.8-octanediol dimethacrylate, neopentyl glycol dimethacrylate, glycerin dimethacrylate, bis(acryloxyneopentyl glycol) adipate, glycerin dimethacrylate, trimethylolpropane trimethacrylate, a trimethylolpropane ethylene oxide-modified triacrylate as represented by the following formula (22)

[Formula 16]

(22)

a trimethylolpropane ethylene oxide-modified trimethacrylate as represented by the following formula (23)

[Formula 17]

(23)

a trimethylolpropane propylene oxide-modified triacrylate as represented by the following formula (24)

[Formula 18]

(24)

and a trimethylolpropane propylene oxide-modified trimethacrylate as represented by the following formula (25),

[Formula 19]

(25)

Ditrimethylolpropane tetraacrylate, pentaerythritol tetraacrylate, pentaerythritol triacrylate, dipentaerythritol hexaacrylate, ethoxylated isocyanurate triacrylate, 3-methyl 1,5-pentanediol diacrylate, tricyclodecane dimethanol diacrylate, hydroxypivalic acid neopentyl glycol diacrylate, 5-ethyl-2-(2-hydroxy-1,1-dimethylethyl)-5-hydroxymethyl-1,3-dioxane diacrylate, ethylene glycol diglycidyl ether acrylic acid additive, propylene glycol diglycidyl ether acrylic acid additive, 1,6-bis(acryloyloxy)-2,2,3,3,4,4,5,5-octafluorohexane, 2-butyl-2-ethyl-1.3-propanediol diacrylate, ECH-modified 1,6-hexanediol diacrylate, propoxylated neopentyl glycol diacrylate, cyclohexane dimethanol diacrylate and the like are exemplified.

Ditrimethylolpropane tetramethacrylate, pentaerythritol tetramethacrylate, pentaerythritol trimethacrylate, dipentaerythritol hexamethacrylate, ethoxylated isocyanurate trimethacrylate, 3-methyl 1,5-pentanediol dimethacrylate, tricyclodecane dimethanol dimethacrylate, hydroxypivalic acid neopentyl glycol dimethacrylate, 5-ethyl-2-(2-hydroxy-1,1-dimethylethyl)-5-hydroxymethyl-1,3-dioxane dimethacrylate, ethylene glycol diglycidyl ether methacrylic acid additive, propylene glycol diglycidyl ether methacrylic acid additive, 1,6-bis(methacryloyloxy)-2,2,3,3,4,4,5,5-octafluorohexane, 2-butyl-2-ethyl-1.3-propanediol dimethacrylate, ECH-modified 1,6-hexanediol dimethacrylate, propoxylated neopentyl glycol dimethacrylate, cyclohexane dimethanol dimethacrylate and the like are exemplified.

Examples of the photopolymerization initiator that is preferable to be contained in the photocurable composition include the following photopolymerization initiators.

Acetophenone photopolymerization initiators: acetophenone, 3-methylacetophenone, 4-t-butyl-dichloroacetophenone, 2,2-diethoxyacetophenone and the like.

Benzoin photopolymerization initiators: benzyl, benzoin, benzoinmethyl ether, benzoinisopropyl ether, 2-hydroxy-2-methyl-1-phenyl-1-propanone, 1-(4-isopropylphenyl)-2-hydroxy-2-methylpropan-1-one and the like.

Benzophenone photopolymerization initiators: benzophenone, benzoylbenzoic acid, 4-phenylbenzophenone, hydroxybenzophenone, (1-hydroxycyclohexyl)phenylmetanone and the like.

Thioxanthone photopolymerization initiators: thioxanthone, 2-methylthioxanthone, diethylthioxanthone, 2-chlorothioxanthone and the like.

Anthraquinone photopolymerization initiators: anthraquinone, 2-ethylanthraquinone and the like.

Ketal photopolymerization initiators: acetophenone benzyl ketal, benzyl dimethyl ketal and the like.

Other photopolymerization initiators: diphenyl-2,4,6-trimethylbenzoylphosphine oxide, α-acyloxime ester, camphorquinone and the like.

Examples of commercially available photopolymerization initiators include "IRGACURE®" (for example, IRGACURE® 184, 127, 369, 651, 500, 819, 907, 784, 2959, OXE01, OXE02, CGI-1700, -1750, -1850 and CG24-61), "DAROCUR®" (for example, DAROCUR® 1116 and 1173) and "LUCIRIN®" (for example, LUCIRIN® TPO, LR8893 and LR8970), which are manufactured by BASF SE, "Ubecryl" (for example, Ubecryl P36) manufactured by UCB, and "ESACURE®" (for example, ESACURE® KIP150, ONE) manufactured by LAMBERTI S. p. A, and the like.

Furthermore, as necessary, a sensitizer can be added to the photopolymerization initiator. Examples of the sensitizer include cyanine pigments, merocyanine pigments, coumarin pigments, benzylideneketone pigments, (thio)xanthene pigments, squarylium pigments, (thia)pyrrilium pigments, porphorins, triethylamine, diethylamine, N-methyldiethanolamine, ethanolamine, 4-dimethylaminobenzoic acid, methyl 4-dimethylaminobenzoate, ethyl 4-dimethylaminobenzoate, isoamyl 4-dimethylaminobenzoate and the like, and examples of commercially available sensitizers include "KAYACURE" (for example, KAYACURE ITX, QTX, CPTX and DETX-S) manufactured by Nippon Kayaku Co., Ltd., and "Ubecryl" (for example, Ubecryl P102, 103, 104 and 105) manufactured by UCB, and the like.

The content of the photopolymerization initiator to be incorporated in the composition relating to an aspect of this disclosure is suitably selected. For example, if the content is 0.01 mass % or more, then the curing of the composition can be accelerated. On the other hand, if the content is 10 mass % or less, then the effects of the photopolymerization initiator or the compounds derived therefrom on the kinetic properties, electronic properties or optical properties of the obtained resin can be suppressed by curing the composition. A preferable content is from 0.1 to 7 mass %.

In addition, in order to obtain desired physical properties, for example, a compound having only one acryloyl group or methacryloyl group may be added to the composition relating to an aspect of this disclosure.

Furthermore, the composition relating to an aspect of this disclosure may contain a thermal polymerization initiator.

Examples of the thermal polymerization initiator include peroxides, azo compounds, azide compounds and diazo compounds, and specific examples include benzoyl peroxide, t-butyl-peroxybenzoate, azobisisobutyronitrile, azide benzaldehyde, azide benzalmethylcyclohexanones, azobis compounds such as azobisisobutyronitrile, dimethyl-2,2'-azobis(2-methylpropionate) and the like, aromatic diazonium salts, naphthoquinone diazide compounds, and the like.

Furthermore, the composition relating to an aspect of this disclosure may also contain an additive (a mold release agent) that enables a cured product to have a better mold release property. As the additive, a fluorine-based additive is especially preferable, and examples include "NOVEC®" (for example, NOVEC® FC-4430 and FC-4432) manufactured by Sumitomo 3M Limited, "DSN-403N" manufactured by Daikin Industries, Ltd., and "Megafac" (for example, Megafac F-470, F-475, F-477, RS-72-K, RS-75, TF-1540 and EXP. TF-1760) manufactured by DIC Corporation.

The composition relating to an aspect of this disclosure may contain other additives. The other additives include an antioxidant, an ultraviolet absorber, a light stabilizer, a silane coupling agent, a coating surface-improving agent, a thermal polymerization inhibitor, a leveling agent, a surfactant, a preservation stabilizer, a plasticizer, a lubricant, a solvent, a filler, an antiaging agent, a wettability-improving agent and the like.

Examples of the antioxidants include "IRGANOX®" (for example, IRGANOX® 1010, 1035, 1076, 1222 and 1520L) manufactured by BASF SE, "Antigen" (for example, Antigen P, 3C, FR and GA-80) manufactured by Sumitomo Chemical Co., Ltd., and "Adekastab" (for example, Adekastab AO-50, AO-60, HP-10 and AO-412S) manufactured by ADEKA Corporation, and the like.

Examples of the ultraviolet absorbers include "TINUVIN®" (for example, TINUVIN® P, 234, 320, 326, 327, 328, 329 and 213) manufactured by BASF SE, and "SEESORB®" (for example, SEESORB® 102, 103, 110, 501, 202, 712 and 704) manufactured by Shipro Kasei Kaisha, Ltd., and the like.

Examples of commercially available light stabilizers include "TINUVIN®" (for example, TINUVIN® 292, 144 and 622LD) manufactured by BASF SE, "SANOL™" (for example, SANOL™ LS770) manufactured by Sankyo Co., Ltd., "Sumisorb TM-061" manufactured by Sumitomo Chemical Co., Ltd., "FA-711MM" manufactured by Hitachi Chemical, Co., Ltd., and "Adekastab" (for example, Adekastab LA-72, LA-81 and LA-82) manufactured by ADEKA Corporation, and the like.

Examples of the silane coupling agents include γ-aminopropyltriethoxysilane, γ-mercaptopropyltrimethoxysilane, γ-methacryloxypropyltrimethoxysilane and the like, and commercially available products include "SH6062" and "SH6030" manufactured by Dow Corning Toray Co., Ltd., and "KBM" (for example, KBM 903, 603, 503 and 403) manufactured by Shin-Etsu Chemical Co., Ltd., and the like.

The fine pattern of the master mold is transferred, whereby a resin mold for imprinting can be obtained by conducting a step of pressing a master mold having a concavo-convex corresponding to a fine pattern against the composition relating to an aspect of this disclosure formed on the surface of a substrate, or by putting the composition of the compound on a master mold having a concavo-convex corresponding to a fine pattern by a method such as dropwise addition or application, putting a substrate thereon, and curing the composition by irradiating with light while sandwiching the composition between the substrate and the master mold and applying a pressure. Furthermore, the resin mold formed from the composition of an aspect of this disclosure is a mold that has fine mold releasing property against a photocured layer in an imprinting method and is excellent in durability in repeated use and transferring.

The method for preparing a resin mold for photo imprinting relating to an aspect of this disclosure and the photoimprinting method using the resin mold will be explained while referring to FIGS. 1 and 2.

Figure 1:
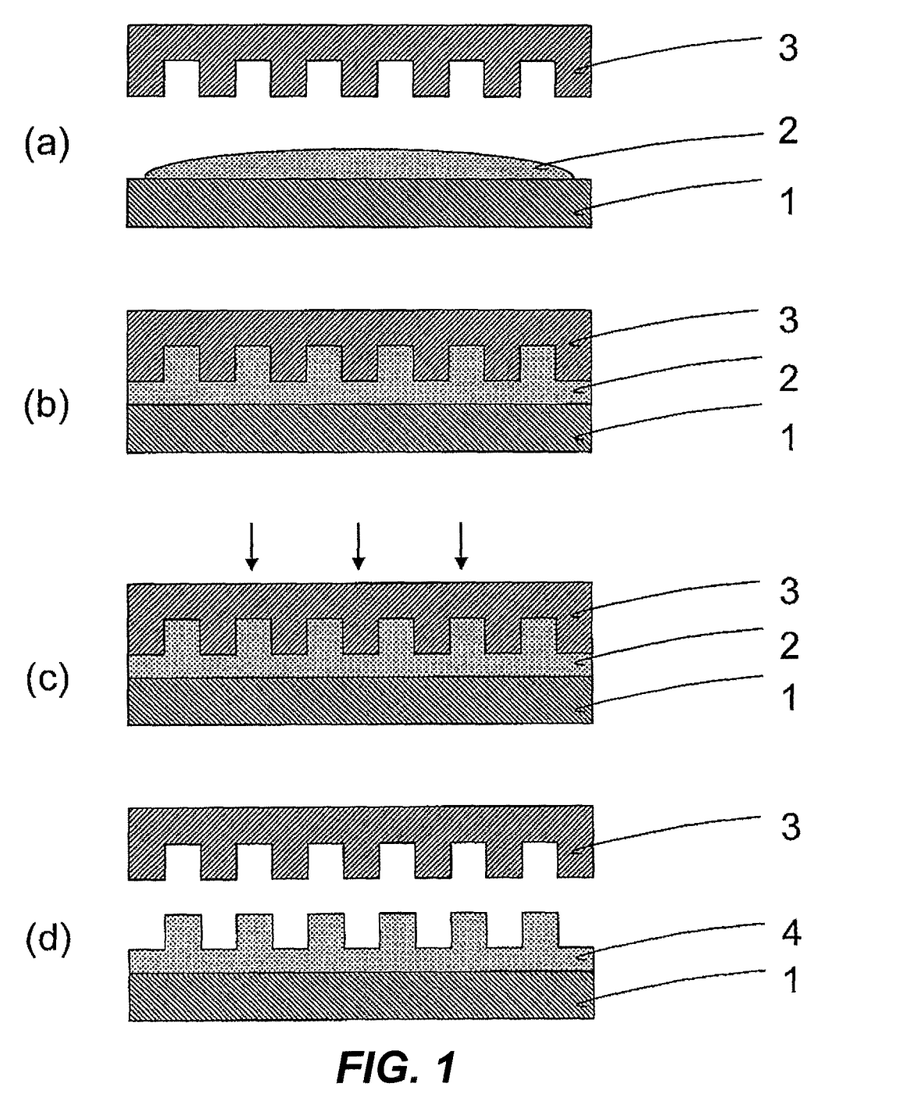
FIG. 1 is a drawing showing an example of a process for manufacturing a resin mold from a master mold, relating to an aspect of this disclosure.

Specifically, first, as illustrated in FIG. 1, row (a), a transparent substrate 1 and a master mold 3 on which a concavo-convex pattern has been formed are prepared, and the composition 2 relating to an aspect of this disclosure is disposed on the substrate 1. As illustrated in FIG. 1, row (b), the composition 2 of an aspect of this disclosure is sandwiched between the substrate 1 and the master mold 3, whereby the concave parts of the concavo-convex pattern on the master mold 3 are filled with the composition of an aspect of this disclosure (filling step). Although FIG. 1 describes the substrate 1 on which the composition 2 relating to an aspect of this disclosure is disposed, the composition 2 relating to an aspect of this disclosure may also be disposed on the master mold 3.

The substrate 1 is suitably selected. For example, in the case when the composition relating to an aspect of this disclosure is cured by light irradiation in the state that the composition is sandwiched between the master mold 3 and the substrate 1, a substrate transmitting a light is suitable.

Examples include transparent inorganic substrates such as glass, quartz and sapphire, ceramic substrates, and synthetic resin substrates such as polycarbonates, PETs (polyethylene telephthalates) and triacetylcellulose. Furthermore, the surface of the substrate 1 may have undergone a pretreatment so as to adjust the affinity with the composition 2 relating to an aspect of this disclosure. Specific examples of the pretreatment include wet surface washing, surface modification by plasma washing, ozone washing or the like, treatments such as silane coupling agents, and the like.

The method for disposing the composition 2 relating to an aspect of this disclosure on the substrate 1 or master mold 3 is not especially limited, and examples include application or dropwise addition of the composition relating to an aspect of this disclosure, which has been diluted with a solvent or the like as necessary, and specific examples include spin coating, roll coating, dip coating, gravure coating, die coating, curtain coating, inkjet application and dispenser application, and the like.

The composition 2 relating to an aspect of this disclosure may be disposed so as to cover the whole surface of the master mold 3 or substrate 1, or can be disposed by corresponding to a part thereof.

As the master mold 3, a master mold in which a desired pattern such as a concavo-convex pattern has been formed on the surface is used. Examples of the material of the mold 3 include inorganic compounds such as silicon, silicon carbide, silicon oxide, metals and metal oxides such as nickel, and the like besides quartz glass, synthetic resins such as PDMS (polydimethylsiloxane), and the like. The appearance of the master mold 3 may be similar to the appearance of a mold that is used in a general photo imprinting method and, for example, the appearance may be a cuboid shape or a roll shape.

Furthermore, in order to improve the mold release property, the master mold 3 may be such that the surface of the master mold 3 has undergone a treatment for improving the mold release property (mold release treatment). The mold release treatment can be conducted by a gas phase process, a liquid phase process or the like, by using a known mold release treatment agent as exemplified in perfluoro or hydrocarbon polymer compounds, alkoxysilane compounds or trichlorosilane compounds, diamond-like carbon and the like. Examples of commercially available fluorine mold release treatment agents include "OPTOOL®" (for example, OPTOOL® DSX, HD1100Z and HD2100Z) manufactured by Daikin Industries, Ltd., and the like.

Furthermore, the concavo-convex pattern formed on the surface of the master mold 3 is suitably selected. For example, the pattern may be similar to a concavo-convex pattern formed on the surface of a mold that is used in a general photoimprinting method. For example, the master mold 3 may be made by forming recesses on the surface of the material of the master mold 3 to form concave parts, and in this case, the parts that are relatively projecting to the side of the surface become convex parts. Alternatively, the master mold 3 may be made by providing projections to the surface of the material of the master mold 3 to form convex parts, and in such case, the parts that are relatively recessed to the inner side become concave parts. Furthermore, the master mold 3 may be made by using, as a casting mold, a master disc having a concavo-convex pattern formed by providing recesses or projections to the surface of the material of the master disc. The shape of the cross-sectional surface of each concave part of the concavo-convex pattern may be, for example, a square shape, a rectangular shape, a triangle shape, a circular shape, a half-circular shape, a shape that is similar to either of those shapes, or the like, and each concave part may have, for example, a depth of about 0.00001 to 3 mm, an opening diameter of about 0.00001 to 5 mm.

The composition 2 relating to an aspect of this disclosure is disposed on the substrate 1 or master mold 3 in such way, then the substrate 1 and master mold 3 are opposed, and as illustrated in FIG. 1, row (b), the composition 2 is brought into contact with the surface on which the concavo-convex pattern has been formed of the master mold 3, whereby the concave parts of the concavo-convex pattern of the master mold 3 are filled with the composition in an aspect of this disclosure. When the concave parts of the concavo-convex pattern are filled with the composition 2 in an aspect of this disclosure, a force of about 0.01 to 10 MPa may also be applied as necessary. In addition, an apparatus in a conventional photoimprinting method can also be used.

Subsequently, as illustrated in FIG. 1, row (c), the composition 2 is cured by irradiating with light in the state that the composition 2 in an aspect of this disclosure has been brought into contact with the master mold 3, and that concave parts of the concavo-convex pattern of the master mold 3 have been filled with the composition 2 relating to an aspect of this disclosure, whereby a resin mold 4 is formed (a photocuring step).

The light source used for the exposure to light may be any one source as long as it can irradiate light at a wavelength at which the above-mentioned composition is cured, for example, light at a wavelength of from 200 to 500 nm, and it is necessary that the light has a wavelength at which the light transmits at least a part of the substrate 1 or master mold 3. Examples of the light source include low pressure mercury lamps, high pressure mercury lamps, ultra-high pressure mercury lamps, metal halide lamps, xenon lamps, carbon arc, mercury xenon lamps, excimer lasers such as XeCl and KrF, ultraviolet or visible light lasers, ultraviolet or visible light LEDs, and the like. The dose of the light may be an amount at which the composition can be cured. When carrying out this disclosure, it is generally preferable to select the dose within the range of from 10 mJ/cm$^2$ to 500 J/cm$^2$, and the dose is suitably selected depending on the composition in an aspect of this disclosure, the desired thickness of the resin layer, or the like. In addition, the composition 2 relating to an aspect of this disclosure is irradiated with light from the side of the element that is substantially transparent against the irradiated light among the substrate 1 and the master mold 3.

Subsequently, as illustrated in FIG. 1, row (d), the master mold 3 is released from the resin mold 4 in an aspect of this disclosure, and where necessary, the resin mold 4 in an aspect of this disclosure is peeled from the substrate 1, whereby the resin mold 4 in an aspect of this disclosure in which the concavo-convex pattern of the master mold 3 has been inverted and transferred can be formed.

The method for using the obtained resin mold 4 in an aspect of this disclosure is suitably selected and, for example, in a photo nanoimprinting method, the resin mold can be used in a method for manufacturing a resin by using the resin mold in an aspect of this disclosure and a precursor of a photocurable resin for pattern formation.

Figure 2:
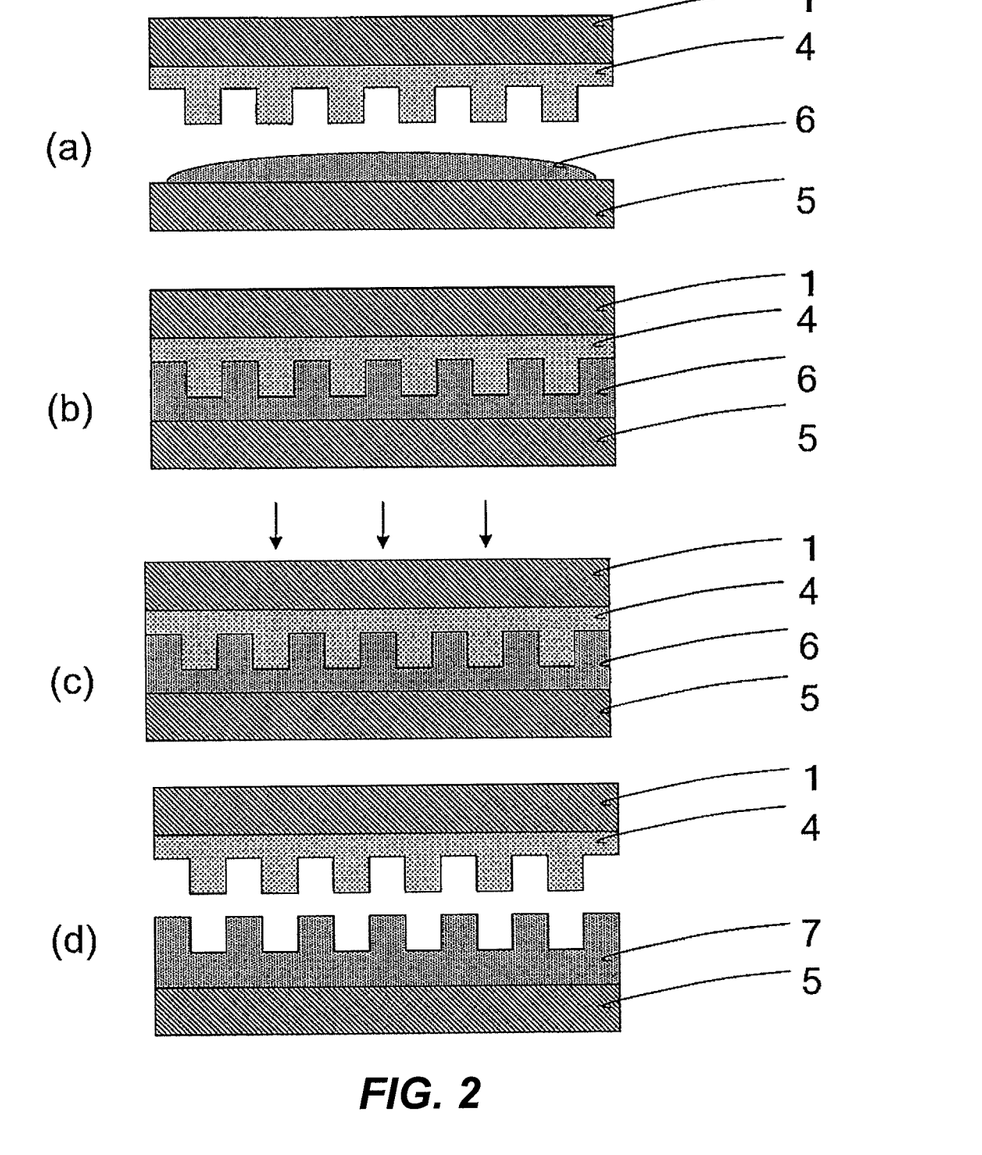
FIG. 2 is a drawing showing an example of a process for manufacturing a photocured layer from a resin mold, relating to an aspect of this disclosure.

Specifically, first, as illustrated in FIG. 2, row (a), the substrate 5 and the resin mold 4 on which a concavo-convex pattern has been formed relating to an aspect of this disclosure are prepared, the resin precursor 6 is disposed on the substrate 5, and as illustrated in FIG. 2, row (b), the resin precursor 6 is sandwiched between the substrate 5 and the resin mold 4 in an aspect of this disclosure, and the concave parts of the concavo-convex pattern of the resin mold 4 in an aspect of this disclosure are filled with the resin precursor 6 (a filling step). In addition, although FIG. 2, row (b), describes the substrate 5 on which the resin precursor 6 has been disposed, the resin precursor 6 may also be disposed on the resin mold 4 in an aspect of this disclosure.

The substrate 5 may be any one as long as the resin precursor 6 can be disposed and, for example, may be a substrate that is used in a general photoimprinting method. Specific examples include semiconductor substrates such as silicon wafers, compound semiconductors such as GaAs, InAs and GaN, transparent inorganic substrates such as glass, quartz and sapphire, ceramic substrates, synthetic resin substrates such as polycarbonates, PET (polyethylene telephthalates) and triacetyl cellulose, metals or metal oxides, and the like. Furthermore, the transparent substrate 5 includes glass substrates, quartz substrates, sapphire substrates, transparent synthetic resin substrates and the like. In addition, the surface of the substrate 5 may have undergone a pretreatment so as to adjust the affinity to the resin precursor 6. Specific examples of the pretreatment include wet-type surface washing, surface modifications by plasma, ozone washing and the like, treatments by adhesiveness-improving agents such as silane coupling agents and the like.

The method for disposing the resin precursor 6 on the substrate 5 or the resin mold 4 is not especially limited and, for example, application or dropwise addition of the composition in an aspect of this disclosure, which has been diluted with a solvent or the like as necessary, specifically, spin coating, roll coating, dip coating, gravure coating, die coating, curtain coating, inkjet application and dispenser application and the like, are exemplified.

The resin precursor 6 may be disposed so as to cover the whole surface of the resin mold 4 or substrate 5, or may be disposed corresponding to a part thereof.

The appearance of the resin mold 4 may be similar to the appearance of the master mold 3 that is used in a general photo imprinting method and, for example, the appearance may be a cuboid shape or a roll shape. Furthermore, an inverted concavo-convex pattern of the master mold 3 has been formed as the concavo-convex pattern that has been formed on the surface of the resin mold 4.

In such way, the resin precursor 6 is disposed on the substrate 5 or the resin mold 4, then the substrate 5 and the resin mold 4 are opposed, as illustrated in FIG. 2, row (b) the resin precursor 6 is brought into contact with the surface on which the concavo-convex pattern has been formed of the resin mold 4, and the concave parts of the concavo-convex pattern of the resin mold 4 are filled with the resin precursor 6. During this filling, a force within the range of about 0.01 to 10 MPa may be applied as necessary. In addition, an imprint apparatus in a conventional photoimprinting method can be used.

Furthermore, as illustrated in FIG. 2, row (c), the resin precursor 6 is cured by irradiation of light in a state that the concave parts of the concavo-convex pattern of the resin mold 4 are filled with the resin precursor 6 by bringing the resin precursor 6 into contact with the resin mold 4, whereby a photocured layer 7 is formed (a photocuring step).

Examples of the light source used for light irradiation include light sources that are similar to those used in the photocuring step in the preparation of the above-mentioned resin mold 4. The dose of the light may be any amount as long as the resin precursor 6 can be cured. When an aspect of this disclosure is carried out, the dose of the light differs depending on the composition of the precursor of the resin to be cured, the thickness of the layer, or the like, and it is preferable to select the dose within a range of generally 10 mJ/cm$^2$ to 10 J/cm$^2$. In addition, the resin precursor 6 is irradiated with light from the side that is substantially transparent against the irradiated light among the substrate 5 and the resin mold 4.

Subsequently, as illustrated in FIG. 2, row (d), the resin mold 4 is released from the photocured layer 7, and the photocured layer 7 is peeled from the substrate 5 as necessary, whereby the photocured layer 7 to which the concavo-convex pattern of the resin mold 4 has been transferred can be formed.

EXAMPLES

This disclosure will be explained more specifically with indicating Examples. This disclosure is not limited to the following Examples.

<Preparation of Resin Precursor Q>

86 parts by mass of 2-ethylhexyacrylate (manufactured by Kyoeisha Chemical Co., Ltd.) as a photopolymerizable compound, 10 parts by mass of trimethylolpropane triacrylate (manufactured by Kyoeisha Chemical Co., Ltd.), and 4 parts by mass of 2-hydroxy-2-methyl-1-phenyl-1-propanone ("DAROCUR® 1173" manufactured by BASF SE) as a photopolymerization initiator were stirred and mixed under room temperature to give a resin precursor Q.

Examples 1 to 5 and Comparative Examples 1 to 2

<Preparation of Composition>

At the composition as indicated in Table 1, a urethane methacrylate ("FLUOROLINK® MD700" manufactured by Solvay Specialty Polymers Japan K. K.: molecular weight: 1,500) represented by the following formula (26), various photocurable compounds, and 2 parts by mass of (1-hydroxycyclohexyl)phenylmetanone (IRGACURE® 184 manufactured by BASF SE) as a photopolymerization initiator were stirred and mixed at room temperature to prepare a composition. Among the compounds described in Table 1, for example, FLUOROLINK® MD700 corresponds to a compound having a substituent (a) being at least either one of an acryloyl group and a methacryloyl group, and a perfluoroalkylene group in some embodiments of this disclosure. On the other hand, ethylene glycol dimethacrylate, trimethylolpropane trimethacrylate, dipentaerythritol hexaacrylate and trimethylolpropane propylene oxide-modified triacrylate correspond to, for example, a compound having a substituent (b) being either one of an acryloyl group and a methacryloyl group, and a substituent (c) being either one of an acryloyl group and a methacryloyl group in some embodiments of this disclosure.

[Formula 20]

(26)

<Preparation of Resin Mold>

First, the composition was added dropwise with a dropper onto a quartz mold (length: 50 mm, width: 50 mm, thickness: 1 mm) that had undergone a mold release treatment with a commercially available fluorine mold release treatment agent ("OPTOOL® HD1100Z" manufactured by Daikin Industries, Ltd.), on which a fine concavo-convex pattern had been formed. A non-alkali glass substrate (length: 50 mm, width: 50 mm, thickness: 1 mm) was then pressed against the composition from the above. In this state, a homogeneous load of a pressure of 0.05 kN was applied by using an imprint apparatus (ST02 manufactured by Toshiba Machine Co., Ltd.), the substrate was retained in the pressurized state for 60 seconds and exposed to light from the side of the quartz mold by using an LED light source at a wavelength of 365 nm under a nitrogen atmosphere, whereby the photocuring of the composition was conducted. At this time, five sheets of polyethylene telephthalate films (PET films) each having a thickness of 100 μm were inserted to the gap between the quartz mold and non-alkali glass substrate so as not to contact the composition, whereby the gap between the quartz mold and the non-alkali glass was controlled so that the gap became 500 μm. The amount of the light exposure was 3,000 mJ/cm$^2$. The quartz mold was peeled after the photocuring, whereby a resin mold having a thickness of 500 μm formed on the non-alkali substrate and having a fine concavo-convex pattern was obtained.

<Evaluation of Transfer Durability of Resin Mold>

The resin precursor Q was added dropwise to the resin mold on the non-alkali glass substrate, which was prepared as above. A PET film was then put on the resin precursor Q from the above, the resin precursor Q was sandwiched between the PET film and the above-mentioned resin mold, the resin precursor Q was cured by exposing to ultraviolet light by 1 J/cm² from the side of the surface of the PET film by using a ultra-high pressure mercury lamp to form a photocured layer, and the photocured layer was peeled from the resin mold.

[Formula 21]

(27)

The above-mentioned series of operations including dropwise addition of the resin precursor Q—exposure to light—peeling (a durability test) were repeated, and whether or not significant roughness that can be distinguished by visual observation can be seen on the surface of the resin mold was observed, and the transfer durability of the resin mold was evaluated from the result as follows.

The generation of the significant roughness on the surface of the resin mold is due to the decrease in the mold release property of the resin mold based on the deterioration of the surface of the resin mold, and the like. When significant roughness generates on the surface of the resin mold, significant roughness is seen on the surface of the obtained photocured layer.

⊙ (fine); Roughness is substantially absent, or little, on the surface of the resin mold after 200 times of durability tests.

○ (slightly fine); Significant roughness generates on the surface of the resin mold after 51 to 200 times of durability tests.

× (Poor); Significant roughness generated on the surface of the resin mold after 10 to 50 times of durability tests.

In the resin molds prepared from the compositions of Examples 1 to 5, significant roughness was not seen on the surface of the resin mold even after 200 times of durability tests had been conducted, and thus fine transfer durability (⊙) was indicated (see Table 1). On the other hand, in the resin molds prepared from the compositions of Comparative Examples 1 to 2, significant roughness generated on the surface of the resin mold after 10 times to 50 times of durability tests had been conducted, and thus the transfer durability was poor (×) (see Table 1). By adding the compound having a substituent (b) being either one of an acryloyl group and a methacryloyl group, and a substituent (c) being either one of an acryloyl group and a methacryloyl group in this way, the transfer durability is improved as compared to the case when the compound is not added. In the above-mentioned result, "× (poor)" is the evaluation in the case when the durability of the resin mold is on the following criterion, and does not mean that the resin mold cannot be used in all cases. In other words, even the resin composition that has been judged as "× (poor)" can be used as a material for forming a resin mold depending on the required number of transfers and the degree of fineness. As a matter of course, use as a composition for forming transferred material layers other than resin molds is not prevented.

Example 6 and Comparative Example 3

<Synthesis of Urethane Methacrylate (A) Having Carbon-Fluorine Bonds Represented by the Following Formula (27)>

51.2 g (0.028 mol) of a fluorinated polytetramethylene glycol represented by the following formula (28) ("Fluorinated PTMG650 DIOL" manufactured by Exfluor Research Corp.), 7.18 g (0.046 mol) of 2-methacryloyloxyethyl isocyanate ("KARENZMOI®" manufactured by Showa Denko K. K.) and 8 mg of dibutyltin dilaurate as a catalyst were added to a three-necked flask equipped with a water cooling condenser, and dissolved to give a solution.

[Formula 22]

(28)

The molecular weight of the fluorinated polytetramethylene glycol represented by the above-mentioned formula was calculated from $^{19}$F NMR with referring to the method of a non-patent literature (Macromol. Chem. Phys. 198, 1893-1907 (1997)). The result of the NMR about the fluorine polytetramethylene glycol was as follows.

$^{19}$F NMR (376 MHz, $C_6F_6$/DMSO-d, 25° C., ppm)

σ: −110.725 (m, —$CF_2CF_2CF_2CH_2OH$), σ: −108.885 (m, —$OCF_2CF_2CF_2CF_2O$—), σ: −106.075 (m, —$CF_2CH_2OH$), σ: −66.655 (m, —$OCF_2CF_2CF_2CF_2O$— and —$OCF_2CF_2CF_2CH_2OH$), When an integral value of the fluorine in (—$CF_2CH_2OH$) obtained by $^{19}$F NMR is deemed as 1 and an integral value of the fluorine in (—$CF_2CF_2CF_2CF_2O$—) is deemed as S, the number n of the repeating structures (—$CF_2CF_2CF_2CF_2O$—) of the fluorinated polytetramethylene glycol is represented by n=S/2.

From the result of $^{19}$F NMR, when the integral value of the fluorine at σ: −106.075 (m, —$CF_2CH_2OH$) is deemed as 1.0, the integral value of the fluorine at σ: −110.725 (m, —$CF_2CF_2CF_2CH_2OH$) was 1.0, the integral value of the fluorine at σ: −108.885 (m, —$OCF_2CF_2CF_2CF_2O$—) was 8.3, and the integral value of the fluorine at σ: −66.655 (m, —$OCF_2CF_2CF_2CF_2O$— and —$OCF_2CF_2CF_2CH_2OH$) was 10.0. From the ratio of these integral values, the integral value of the fluorine of the site of (—$OCF_2CF_2CF_2CH_2OH$) can be calculated as 3.0, and the sum of the integral values of the fluorine of the fluorinated polytetramethylene glycol can be calculated as 20.3 (an average value). The difference between the sum of the integral values of the fluorinated polytetramethylene glycol and the integral value of the fluorine of the site of (—OCF$_2$CF$_2$CF$_2$CH$_2$OH) is the value of the integral value S of the fluorine of the repeating structure parts (—CF$_2$CF$_2$CF$_2$CF$_2$O—) of the fluorinated polytetramethylene glycol, and S equals 17.3 (an average value). As a result of the calculation of the value of n of the repeating structure parts of the fluorinated polytetramethylene glycol was calculated from the above-mentioned formula, n equals 8.65 (an average value), and the molecular weight of the fluorinated polytetramethylene glycol was 2246 (an average value).

Furthermore, the above-mentioned obtained solution was stirred at 70° C. for 4 hours to give a urethane methacrylate A. The structure of the obtained urethane methacrylate (A) was confirmed by an NMR spectrum. The result is as follows.

$^1$H NMR (400 MHz, CD$_3$COCD$_3$, 25° C., ppm)

σ: 1.893 (s, —CH$_3$), σ: 3.496-3.509 (m, CH$_2$NHCO), σ: 4.204-4.230 (m, CH$_2$OCO), σ: 4.720 (m, CF$_2$—CH$_2$O), σ: 5.595-5.599 (m, CCH$_3$—CH$_2$), σ: 6.084 (s, CCH$_3$—CH$_2$), σ: 6.984 (s, NHCH$_2$)

$^{19}$F NMR (376 MHz, C$_6$F$_6$/DMSO-d, 25° C., ppm)

σ: −110.691, σ: −109.066, σ: −104.299, σ: −97.946, σ: −66.641)

Furthermore, since the value of n of the repeating structure parts of the fluorinated polytetramethylene glycol was represented by n=8.65 (an average value), the obtained urethane methacrylate (A) had a molecular weight of 2,560 (an average value).

<Preparation of Composition>

At the composition as indicated in Table 2, the urethane methacrylate (A) obtained in the above-mentioned synthesis process, ethylene glycol dimethacrylate ("Light Ester EG" manufactured by Kyoeisha Chemical Co., Ltd.), and 0.5 parts by mass of (1-hydroxycyclohexyl)phenylmetanone ("IRGACURE® 184" manufactured by BASF SE) as a photopolymerization initiator were stirred and mixed at room temperature to prepare a composition. In addition, among the compounds described in Table 2, the urethane methacrylate (A) corresponds to, for example, the compound having a substituent (a) being at least either one of an acryloyl group and a methacryloyl group, and a perfluoroalkylene group in some embodiments of this disclosure. On the other hand, the ethylene glycol dimethacrylate corresponds to, for example, the compound having a substituent (b) being either one of an acryloyl group and a methacryloyl group, and a substituent (c) being either one of an acryloyl group and a methacryloyl group in some embodiments of this disclosure.

<Preparation of Resin Mold>

A resin mold was prepared by a similar method to that of Examples 1 to 5 and Comparative Examples 1 to 2, except that the composition was the composition indicated in Table 2.

<Evaluation of Transfer Durability of Resin Mold>

Transfer tests were repeated by a similar method to that of Examples 1 to 5 and Comparative Examples 1 to 2, and it was observed whether or not significant roughness on the surface that can be distinguished by visual observation can be seen on the photocured layer, and the transfer durability of the resin mold was evaluated from the result as follows.

The generation of the roughness on the surface of the resin mold is due to the decrease in the mold release property of the resin mold based on the deterioration of the resin mold, and the like. When significant roughness generates on the surface of the resin mold, significant roughness is seen on the surface of the obtained photocured layer.

⊙ (fine); Roughness is substantially absent, or little, on the surface of the resin mold after 400 times of durability tests.

× (Poor); Significant roughness generated on the surface of the resin mold after 200 to 300 times of durability tests.

In the resin mold prepared from the composition of Example 6, significant roughness was not seen on the surface of the resin mold even after 400 times of durability tests had been conducted, and thus fine transfer durability (⊙) was indicated. Furthermore, in Comparative Example 3, significant roughness generated on the surface of the resin mold after 200 to 300 times of durability tests, and thus the transfer durability was poor (×). By adding the compound having a substituent (b) being either one of an acryloyl group and a methacryloyl group, and a substituent (c) being either one of an acryloyl group and a methacryloyl group in this way, the transfer durability of the resin mold is improved as compared to the case when the compound is not added. In the above-mentioned result, "× (poor)" is the evaluation in the case when the durability of the resin mold is on the following criterion, and does not mean that the resin mold cannot be used in all cases. In other words, even the resin composition that has been judged as "× (poor)" can be used as a material for forming a resin mold depending on the required number of transfers and the degree of fineness. As a matter of course, use as a composition for forming transferred material layers other than resin molds is not prevented.

TABLE 1

| | | | Acryl equivalent *8 | Example 1 | Example 2 | Example 3 | Example 4 | Example 5 | Comparative Example 1 | Comparative Example 2 |
|---|---|---|---|---|---|---|---|---|---|---|
| Photcurable components | photocurable compound | FLUORIKUNK MD700 *1 | 750 | 91 | 76 | 91 | 91 | 86 | 96 | 91 |
| | | Ethylene glycol dimethacrylate *2 | 99 | 5 | 20 | | | | | |
| | | Trimethylol propanetrimethacrylate *3 | 113 | | | 5 | | | | |
| | | Dipentaerythritol hexaacrylate *4 | 97 | | | | 5 | | | |
| | | Trimethylol propane prolyleneoxide modified trimethacrylate *5 | 215 | | | | | 10 | | |
| | | Cyclohexylacrylate *6 | 154 | | | | | | | 5 |

TABLE 1-continued

|  |  | Acryl equivalent *8 | Example 1 | Example 2 | Example 3 | Example 4 | Example 5 | Comparative Example 1 | Comparative Example 2 |
|---|---|---|---|---|---|---|---|---|---|
| photo polymerization initiator | (1-hydroxy cyclohexyl)phenylmethane *7 |  | 2 | 2 | 2 | 2 | 2 | 2 | 2 |
| Evaluation of transfer durability of resin mold |  |  | ⊚ | ⊚ | ⊚ | ⊚ | ⊚ | X | X |

Evaluation method: ⊙ no surface roughness was seen after 200 times, X surface roughness generated after 10 to 50 times
*1) manufactured by Solvay Specialty Polymers Japan K. K.
*2) "Light Ester EG" manufactured by KYOEISYA Chemical Co., LTD
*3) "Light Ester TMP" manufactured by KYOEISYA Chemical Co., LTD
*4) "Light Acrylate DPE6A" manufactured by KYOEISYA Chemical Co., LTD
*5) "ARONYX M-321" manufactured by TOAGOSEI Co., LTD
*6) "Blemmer CHA" manufactured by NOF Corporation
*7) "IRGACURE 184" manufactured by BASF
*8) value being a molecular weight divided by a total number of the acryloyl group and the methacryloyl group contained in the compound

TABLE 2

|  |  |  | Acryl equivalent *8 | Example 6 | Comparative Example 3 |
|---|---|---|---|---|---|
| Photocurable components | photocurable compound | Urethane methacrylate | 1280 | 76 | 96 |
|  |  | Ethylene glycol dimethacrylate *2 | 99 | 20 | — |
|  | photo polymerization iniciator | (1-hydroxy cyclohexyl)phenylmethane *7 |  | 2 | 2 |
| Evaluation of transfer durability of resin mold |  |  |  | ⊚ | X |

Evaluation method: ⊚ no surface roughness was seen after 400 times,
X surface roughness generated after 200 to 300 times

The invention claimed is:

1. A composition consisting of:
   a first light curable portion consisting of
   compound (A) having a substituent (a) being at least either one of an acryloyl group and a methacryloyl group, and a perfluoroalkylene group; and
   compound (B) having a substituent (b) being either one of an acryloyl group and a methacryloyl group, and a substituent (c) being either one of an acryloyl group and a methacryloyl group,
   wherein, compound (B) is a bifunctional or higher functional polymerizable compound,
   wherein a ratio of compound (A) in the composition to compound (B) in the composition is from 40:60 to 99.9:0.1 by mass, and
   wherein compound (A) is at least one selected from a compound represented by the following Formula (1) and a compound represented by the following Formula (2):

Formula (1)

-continued wherein, each of $R^1$, $R^2$, $R^3$ and $R^4$ in Formula (1) represents a substituent containing at least one of a hydrogen atom, a carbon atom, a nitrogen atom, and a sulfur atom, and "n" in Formula (1) represents an integer of 1 to 10, and Formula (2)

wherein, each of $R^5$, $R^6$, $R^7$ and $R^8$ in Formula (2) represents a substituent containing at least one of a hydrogen atom, a carbon atom, a nitrogen atom and a sulfur atom, and each of "m" and "r" in Formula (2) represents an integer of 1 to 30; and, optionally, a second portion selected from the group consisting of a compound having only one acryloyl group or methacryloyl group, a polymerization initiator(s), sensitizer(s), mold release agent(s), antioxidant(s), ultraviolet absorber(s), light stabilizer(s), silane coupling agent(s), thermal polymerization inhibitor(s), leveling agent(s), surfactant(s), preservation stabilizer(s), plasticizer(s), lubricant(s), solvent(s), filler(s), antiaging agent(s), wettability-improving agent(s), and a mixture of any thereof.

2. A light curable composition consisting of:
compound (A) having a substituent (a) being at least either one of an acryloyl group and a methacryloyl group, and a perfluoroalkylene group; and
compound (B) having a substituent (b) being either one of an acryloyl group and a methacryloyl group, and a substituent (c) being either one of an acryloyl group and a methacryloyl group,
wherein, compound (B) is a bifunctional or higher functional polymerizable compound,
wherein a ratio of compound (A) in the composition to compound (B) in the composition is from 40:60 to 99.9:0.1 by mass, and
wherein compound (A) is at least one selected from a compound represented by the following Formula (1) and a compound represented by the following Formula (2):

(3)

(4)

(5)

(6)

(7)

wherein, j in Formula (5) represents 1 or 2, and
each of $R^9$, $R^{10}$, $R^{11}$ and $R^{12}$ in Formula (6) is any one of a hydrogen atom, a methyl group and a substituent represented by the following Formula (8), Formula (1)

wherein, each of $R^1$, $R^2$, $R^3$ and $R^4$ in Formula (1) represents a substituent containing at least one of a hydrogen atom, a carbon atom, a nitrogen atom, and a sulfur atom, and
"n" in Formula (1) represents an integer of 1 to 10, and Formula (2)

wherein, each of $R^5$, $R^6$, $R^7$ and $R^8$ in Formula (2) represents a substituent containing at least one of a hydrogen atom, a carbon atom, a nitrogen atom and a sulfur atom.

3. The composition according to claim 1, wherein each of $R^1$ and $R^2$ in the compound represented by Formula (1) is either one of a hydrogen atom and a methyl group.

4. The composition according to claim 3, wherein each of $R^5$ and $R^6$ in the compound represented by Formula (2) is either one of a hydrogen atom and a methyl group.

5. The composition according to claim 1, wherein at least one of parts represented by the following Formula (3) and Formula (4) of the compound represented by Formula (1) contains any one of structures represented by the following Formula (5), Formula (6) and Formula (7), (8)

wherein, in Formula (4), $R^{13}$ each independently represents a hydrogen atom or a methyl group.

6. The composition according to claim 5,
wherein $R^{11}$ is either one of a hydrogen atom and a methyl group, and each of $R^{10}$ and $R^{12}$ is a hydrogen atom when $R^9$ is the substituent represented by Formula (8), $R^{12}$ is either one of a hydrogen atom and a methyl group, and each of $R^9$ and $R^{11}$ is a hydrogen atom when $R^{10}$ is the substituent represented by Formula (8), $R^9$ is either one of a hydrogen atom and a methyl group, and each of $R^{10}$ and $R^{12}$ is a hydrogen atom when $R^{11}$ is the substituent represented by Formula (8), and

$R^{10}$ is either one of a hydrogen atom and a methyl group, and each of $R^9$ and $R^{11}$ is a hydrogen atom when $R^{12}$ is the substituent represented by Formula (8).

7. The composition according to claim 5, wherein each of $R^9$, $R^{10}$, $R^{11}$ and $R^{12}$ is a hydrogen atom.

8. The composition according to claim 1, wherein at least one of parts represented by the following Formula (9) and Formula (10) of the compound represented by Formula (2) contains any one of structures represented by the following Formula (11), Formula (12) and Formula (13), (9)

(10)

(11)

wherein, k in Formula (11) represents 1 or 2, and
each of $R^{14}$, $R^{15}$, $R^{16}$ and $R^{17}$ in Formula (12) is any one of a hydrogen atom, a methyl group and a substituent represented by the following Formula (14), (14)

wherein, $R^{18}$ in Formula (14) represents a hydrogen atom or a methyl group.

9. The composition according to claim 8,
wherein $R^{16}$ is either one of a hydrogen atom and a methyl group, and each of $R^{15}$ and $R^{17}$ is a hydrogen atom when $R^{14}$ is the substituent represented by Formula (14),

$R^{17}$ is either one of a hydrogen atom and a methyl group, and each of $R^{14}$ and $R^{16}$ is a hydrogen atom when $R^{15}$ is the substituent represented by Formula (14), $R^{14}$ is either one of a hydrogen atom and a methyl group, and each of $R^{15}$ and $R^{17}$ is a hydrogen atom when $R^{16}$ is the substituent represented by Formula (14), and $R^{15}$ is either one of a hydrogen atom and a methyl group, and each of $R^{14}$ and $R^{16}$ is a hydrogen atom when $R^{17}$ is the substituent represented by Formula (14).

10. The composition according to claim 8, wherein each of $R^{14}$, $R^{15}$, $R^{16}$ and $R^{17}$ is a hydrogen atom.

11. The composition of claim 1, wherein the compound (A) is represented by Formula 1:

12. The composition of claim 1, wherein the compound (A) is represented by Formula (2):

(2)

-continued (12)

(13)

13. The composition of claim 12, wherein each of $R^5$ and $R^6$ in Formula 2 is independently selected from the group consisting of a hydrogen atom and a methyl group.

14. The composition according to claim 1,
wherein, compound (B) has a plurality of substituents with polymerization activity,
each of the plurality of substituents is either one of an acryloyl group and a methacryloyl group, and
a value being a molecular weight of compound (B) divided by a total number of the acryloyl group and the methacryloyl group contained in compound (B), is within the range of 85 to 230.

15. A method for manufacturing a resin, comprising:
curing the composition according to claim 1.

16. A method for imprinting, comprising:
curing the composition according to claim 1.

17. A method for manufacturing an optical element, comprising:
   curing the composition according to claim 1.

18. A method for manufacturing an electronic element, comprising:
   curing the composition according to claim 1.

19. A resin mold for imprinting, said resin mold produced by curing the composition of claim 1 into the resin mold.

20. A method of photo imprinting, the method comprising:
   utilizing the resin mold of claim 19 to perform the photo imprinting.

21. A method of manufacturing a semiconductor integrated circuit, the method comprising:
   utilizing the resin mold of claim 19 to manufacture the semiconductor integrated circuit.

22. A method of manufacturing a fine optical element, the method comprising:
   utilizing the resin mold of claim 19 to manufacture the fine optical element.

* * * * *